(12) United States Patent
Crane et al.

(10) Patent No.: US 7,108,920 B1
(45) Date of Patent: Sep. 19, 2006

(54) REWORKABLE COMPOSITIONS INCORPORATING EPISULFIDE RESINS

(75) Inventors: Lawrence N. Crane, Brookfield, CT (US); Mark M. Konarski, Old Saybrook, CT (US); Brendan J. Kneafsey, Lucan (IE); Afranio Torres-Filho, Enfield, CT (US); Z. Andrew Szczepaniak, Middletown, CT (US)

(73) Assignees: Henkel Corporation, Rocky Hill, CT (US); Loctite (R&D) Limited, Dublin (IE)

( * ) Notice: Subject to any disclaimer, the term of this patent is extended or adjusted under 35 U.S.C. 154(b) by 1205 days.

(21) Appl. No.: 09/885,269

(22) Filed: Sep. 15, 2000

(51) Int. Cl.
*B32B 27/38* (2006.01)
*H01L 21/56* (2006.01)
*C08G 75/00* (2006.01)
*C08L 63/00* (2006.01)
*C08L 81/00* (2006.01)

(52) U.S. Cl. .................. 428/414; 428/413; 438/127; 523/435; 525/525; 525/535; 528/373; 528/377; 528/380; 528/403

(58) Field of Classification Search .............. None
See application file for complete search history.

(56) References Cited

U.S. PATENT DOCUMENTS

| 5,355,580 A | 10/1994 | Tsukada ................ 29/840 |
|---|---|---|
| 5,512,613 A | 4/1996 | Afzali-Ardakani et al. . 523/443 |
| 5,560,934 A | 10/1996 | Afzali-Ardakani et al. . 424/497 |
| 5,760,337 A | 6/1998 | Iyer et al. ................ 174/52.2 |
| 5,783,867 A | 7/1998 | Belke, Jr. et al. ........... 257/783 |
| 5,872,158 A | 2/1999 | Kuczynski ................ 522/182 |
| 5,932,682 A | 8/1999 | Buchwalter et al. ........ 528/94 |
| 5,948,922 A | 9/1999 | Ober et al. ................ 549/547 |
| 5,973,033 A | 10/1999 | Ober et al. ................ 523/443 |
| 2001/0047043 A1* | 11/2001 | Okoroafor et al. ........... 522/31 |

FOREIGN PATENT DOCUMENTS

| JP | 5102343 | 4/1993 |
|---|---|---|
| JP | 5251516 | 9/1993 |
| JP | 6069280 | 3/1994 |
| JP | 6077264 | 3/1994 |
| WO | 9831738 | 7/1998 |

* cited by examiner

Primary Examiner—Michael J. Feely
(74) Attorney, Agent, or Firm—Steven C. Bauman

(57) ABSTRACT

This invention relates to thermosetting resin compositions useful for mounting onto a circuit board semiconductor devices, such as chip size or chip scale packages ("CSPs"), ball grid arrays ("BGAs"), land grid arrays ("LGAs"), and the like, each of which having a semiconductor chip, such as large scale integration ("LSI"), on a carrier substrate, as well as compounds useful in such compositions. The compositions include compounds having a thermally cleavable linkage, and include an episulfide group within the compound. The compositions of this invention are reworkable when subjected to appropriate conditions.

18 Claims, 2 Drawing Sheets

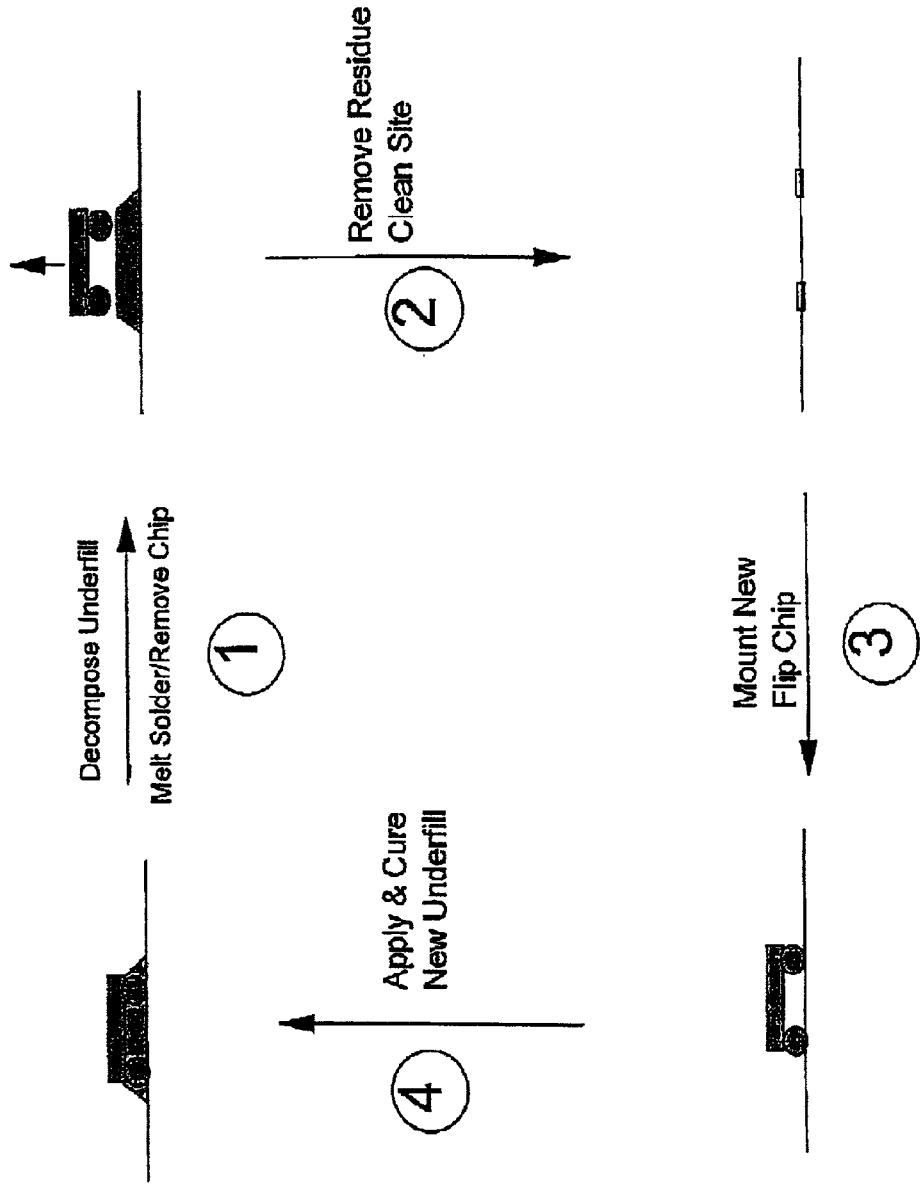

REWORKABLE COMPOSITIONS INCORPORATING EPISULFIDE RESINS

BACKGROUND OF THE INVENTION

1. Field of the Invention

This invention relates to thermosetting resin compositions useful for mounting semiconductor devices onto a circuit board, such as chip size or chip scale packages ("CSPs"), ball grid arrays ("BGAs"), land grid arays ("LGAs") and the like, each of which having a semiconductor chip, such as large scale integration ("LSI"), on a carrier substrate. The compositions of this invention are reworkable when subjected to appropriate conditions.

2. Brief Description of Related Technology

In recent years, the popularity of small-sized electronic appliances, such as camera-integrated video tape recorders ("VTRs") and portable telephone sets, has made size reduction of LSI devices desirable. As a result, CSPs, BGAs, and LGAs are being used to reduce the size of packages substantially to that of bare chips. Such CSPs, BGAs, and LGAs improve the characteristics of the electronic device while retaining many of their operating features, thus serving to protect semiconductor bare chips, such as LSIs, and facilitate testing thereof.

Ordinarily, the CSP/BGA/LGA assembly is connected to electrical conductors on a circuit board by use of a solder connection or the like. However, when the resulting CSP/BGA/LGA circuit board structure is exposed to thermal cycling, the reliability of the solder connection between the circuit board and the CSP/BGA/LGA often becomes suspect. Recently, after a CSP/BGA/LGA assembly is mounted on a circuit board, the space between the CSP/BGA/LGA assembly and the circuit board is often now filled with a sealing resin (often referred to as underfill sealing) in order to relieve stresses caused by thermal cycling, thereby improving heat shock properties and enhancing the reliability of the structure.

However, since thermosetting resins are typically used as the underfill sealing material, in the event of a failure after the CSP/BGA/LGA assembly is mounted on the circuit board, it is very difficult to replace the CSP/BGA/LGA assembly without destroying or scrapping the structure in its entirety.

To that end, techniques for mounting a bare chip on a circuit board are accepted as substantially similar to the mounting of a CSP/BGA/LGA assembly onto a circuit board. One such technique, disclosed in Japanese Laid-Open Patent Publication No. 102343/93, involves a mounting process where a bare chip is fixed and connected to a circuit board by use of a photocurable adhesive, where, in the event of failure, this bare chip is removed therefrom. However, this technique is limited to those instances where the circuit board includes a transparent substrate (e.g., glass) which permits exposure to light from the back side, and the resulting structure exhibits poor heat shock properties.

Japanese Laid-Open Patent Publication No. 69280/94 discloses a process where a bare chip is fixed and connected to a substrate by use of a resin capable of hardening at a predetermined temperature. In the event of failure, this bare chip is removed from the substrate by softening the resin at a temperature higher than the predetermined temperature. However, no specific resin is disclosed, and there is no disclosure about treating the resin which remains on the substrate. Thus, the disclosed process is at best incomplete.

As pointed out in Japanese Laid-Open Patent Publication No. 77264/94, it is conventional to use a solvent to remove residual resin from a circuit board. However, swelling the resin with a solvent is a time consuming process and the corrosive organic acid ordinarily used as the solvent may reduce the reliability of the circuit board. Instead, that disclosure speaks to a method for removing residual resin by irradiation with electromagnetic radiation.

Japanese Laid-Open Patent Publication No. 251516/93 also discloses a mounting process using bisphenol A type epoxy resin (CV5183 or CV5183S; manufactured by Matsushita Electric Industrial Co., Ltd.). However, the removal process so disclosed does not consistently permit easy removal of the chip, the curing step is lengthy at elevated temperatures, and the process generally results in poor productivity.

Of course, mechanical methods of removing/replacing semiconductor chips from/on a substrate are known, such as by cutting the chip to be removed/replaced. See U.S. Pat. No. 5,355,580 (Tsukada).

Thermoplastic underfill resins are known for use in semiconductor chip attachment. See U.S. Pat. No. 5,783,867 (Belke, Jr.). However, such thermoplastic resins tend to leak under relatively modest temperature conditions. In contrast, thermosetting resins cure into a matrix which ordinarily have greater thermal stability under end use operating temperatures.

U.S. Pat. No. 5,512,613 (Afzali-Ardakani), U.S. Pat. No. 5,560,934 (Afzali-Ardakani) and U.S. Pat. No. 5,932,682 (Buchwalter), each refer to a reworkable thermoset composition based on a diepoxide component in which the organic linking moiety connecting the two epoxy groups of the diepoxide includes an acid cleavable acyclic acetal group. With such acid cleavable acyclic acetal groups forming the bases of the reworkable composition, a cured thermoset need only be introduced to an acidic environment in order to achieve softening and a loss of much of its adhesiveness.

U.S. Pat. No. 5,872,158 (Kuczynski) refers to thermosetting compositions capable of curing upon exposure to actinic radiation, which are based on acetal diacrylates, and reaction products of which are reported to be soluble in dilute acid.

U.S. Pat. No. 5,760,337 (Iyer) refers to thermally reworkable crosslinked resins to fill the gap created between a semiconductor device and a substrate to which it is attached. These resins are produced by reacting a dienophile (with a functionality greater than 1) with a 2.5-dialkyl substituted furan-containing polymer.

International Patent Publication No. PCT/US98/00858 refers to a thermosetting resin composition capable of sealing underfilling between a semiconductor device including a semiconductor chip mounted on a carrier substrate and a circuit board to which said semiconductor device is electrically connected. The composition includes about 100 parts by weight of an epoxy resin, about 3 to about 60 parts by weight of a curing agent, and about 1 to about 90 parts by weight of a plasticizer. Here, the area around the cured thermoset is to be heated at a temperature of about 190 to about 260° C. for a period of time ranging from about 10 seconds to about 1 minute in order to achieve softening and a loss of much of its adhesiveness.

U.S. Pat. No. 5,948,922 (Ober) and U.S. Pat. No. 5,973,033 (Ober), each refer to a certain class of compounds having tertiary oxycarbonyl linkages, and compositions based on such compounds, which when cured provide decomposable compositions capable of being reworked.

Notwithstanding the state of the art, it would be desirable for an underfilling sealing material to provide good productivity and thermal shock properties, while allowing the substrates with which it is to be used to be readily processed and easily separated from a semiconductor device without application of acidic media or elevated temperature conditions that may compromise the integrity of the semiconductor devices remaining on the substrate or the substrate itself.

SUMMARY OF THE INVENTION

The present invention provides a curable composition including a compound having at least one thermally cleavable linkage, and which includes a partial or complete episulfide within the compound. The curable composition may be represented by the formula:

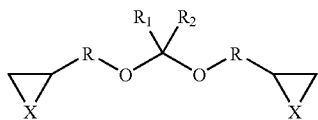

I where each R is independently selected from $C_1$–$C_{10}$ alkyl, cycloalkyl, aryl, aralkyl, and alkaryl; $R_1$ and $R_2$ are each independently selected from hydrogen, methyl, ethyl, propyl, phenyl, hydroxyphenyl, methoxyphenyl, tolyl, and benzyl; and X is independently selected from O and S, provided that at least one X is S. For example, the curable compound may be:

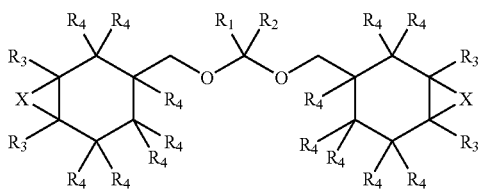

II where $R_1$ and $R_2$ are each independently selected from hydrogen, methyl, ethyl, propyl, phenyl, hydroxyphenyl, methoxyphenyl, tolyl, and benzyl; each $R_3$ is independently selected from hydrogen, methyl, ethyl, propyl, and isopropyl; each $R_4$ is independently selected from hydrogen, methyl, ethyl, propyl, isopropyl, butyl, isobutyl, t-butyl, $C_{1-4}$ alkoxy, halogen, cyano and nitro; and X is independently selected from O and S, provided that at least one X is S.

The curable compound may also be represented by the formula:

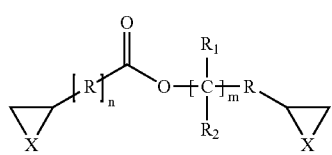

IX where each R is independently selected from $C_1$–$C_{10}$ alkyl, cycloalkyl, aryl, aralkyl, and alkaryl; $R_1$ and $R_2$ are each independently selected from hydrogen, methyl, ethyl, propyl, phenyl, hydroxyphenyl, methoxyphenyl, tolyl, and benzyl; m is 0 or 1; n is 0 or 1, and X is independently selected from O and S, provided that at least one X is S. For example, the curable compound may be:

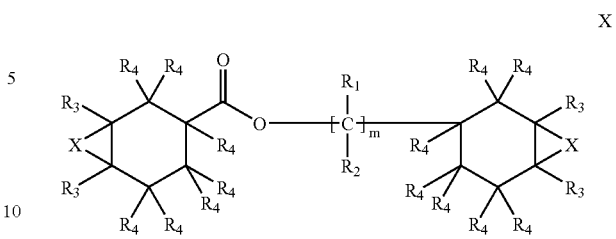

X where $R_1$ and $R_2$ are each independently selected from hydrogen, methyl, ethyl, propyl, phenyl, hydroxyphenyl, methoxyphenyl, tolyl, and benzyl; each $R_3$ is independently selected from hydrogen, methyl, ethyl, propyl, and isopropyl; each $R_4$ is independently selected from hydrogen, methyl, ethyl, propyl, isopropyl, butyl, isobutyl, t-butyl, $C_{1-4}$ alkoxy, halogen, cyano and nitro; m is 0 or 1, and X is independently selected from O and S, provided that at least one X is S.

Combinations of such compounds may also be used.

The invention relates to the curable compounds themselves, as well as reaction products of the curable compounds which form compositions. Reaction products of the curable compounds are reworkable through thermal decomposition under exposure to temperature conditions in excess of those used to cure the composition.

In a further aspect of the invention, a thermosetting resin composition includes a curable compound as set forth above. Such a thermosetting resin composition further includes, broadly, a curing agent component, such as an anhydride component, a nitrogen-containing component, such as an amine compound, an amide compound, and/or an imidazole compound, and combinations thereof, and, optionally, an inorganic filler component. Such a thermosetting resin composition may be used as an underfill sealant between a semiconductor device and a circuit board to which the semiconductor device is electrically connected.

Reaction products of these compositions are capable of softening under exposure to elevated temperature conditions, such as in excess of the temperatures used to cure the composition. Such temperature exposure combined with the curable compound having at least one thermally cleavable linkage provides the reworkable aspect of this invention. The remaining components, discussed below, provide the physical properties and characteristics for the compositions and reaction products to render the compositions attractive for commercial use, particularly in the microelectronics industry.

The inventive composition is particularly useful as an underfilling sealing resin, and enables a semiconductor device, such as a CSP/BGA/LGA assembly which includes a semiconductor chip mounted on a carrier substrate, to be securely connected to a circuit board by short-time heat curing and with good productivity. Reaction products of the inventive compositions demonstrate excellent heat shock properties (or thermal cycle properties), and permit the semiconductor device to be easily removed from the circuit board by localized heating in the event of semiconductor device or connection failure. This makes it possible to reuse the circuit board (with the remaining functioning semiconductor devices still electrically attached) and thereby achieve an improvement in the yield of the production process and a reduction in production cost.

The compositions of this invention may also be used for microelectronic applications beyond sealing underfill, such as with glob top, direct chip attachment and other applications for thermosetting compositions. In addition, the compositions may be used in far-flung applications, where thermosetting epoxies, or for that matter other thermosetting or thermoplastic adhesive, coating and sealant compositions, may be used. For instance, the compositions may be used in the assembly of products, whose component parts have value as do the intermediate/finished products, to facilitate assembly and disassembly thereof where defective component parts are found. In that event, the defective component part(s) may be readily removed from the intermediate/finished product(s) and be replaced without having to scrap the entire intermediate/finished product(s). In addition, the speed with which the disassembly may proceed allows throughput to remain high. A non-microelectronic example of such a part is the assembly of prosthetic devices.

Other benefits and advantages of the present invention will become more readily apparent after a reading of the "Detailed Description" section together with the figures.

BRIEF DESCRIPTION OF THE DRAWINGS

FIG. 2 depicts a flow diagram of a procedure useful to rework a cured thermosetting resin composition in accordance with the present invention, so as to remove a semiconductor device from a circuit board to which it had been attached.

DETAILED DESCRIPTION OF THE INVENTION

Figure 1:
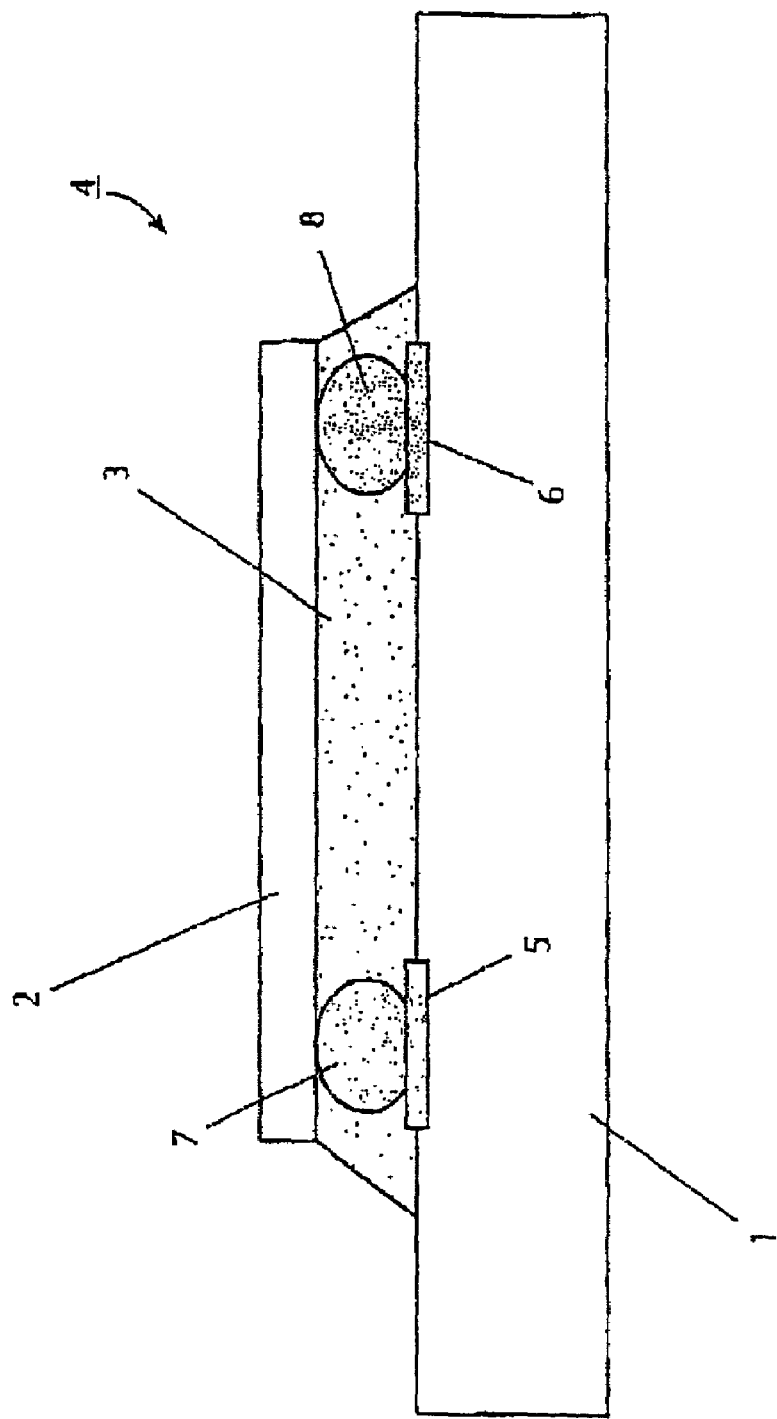
FIG. 1 depicts a cross-sectional view showing an example of the mounting structure in which the thermosetting resin composition of the present invention is used.

As noted above, the present invention provides compounds which include at least one thermally cleavable linkage, and which are useful in curable compositions. In particular, such compounds are useful in compositions which can be cured, such as, for example, underfill sealants between a semiconductor device and a circuit board to which the semi-conductor device is electrically connected. Further, the compounds provide the curable compositions with the capability of being reworkable through thermal decomposition, when the compositions are exposed to temperature conditions in excess of these used to cure the composition. The invention is directed to the curable compounds themselves, as well as curable compositions incorporating such curable compounds therein.

The curable compounds include a thiirane group, thus defining a partial or complete episulfide compound. Desirably, the curable compounds are acetals or esters including episulfide groups at one or both ends of the structure. The curable compounds may further include an epoxy group, so long as at least one moiety of the compound includes an episulfide group.

Curable compositions including epoxy monomers are capable of decomposing to provide reworkable compositions. By providing episulfide groups as opposed to epoxy groups within such reworkable compounds, the present invention provides compounds which produce very pure materials and which are very stable. Moreover, reaction products of the compounds produce low amounts of residual halide, which improves stability and corrosion resistance.

The curable compounds with at least one thermally cleavable linkage may be chosen from those within the following formula:

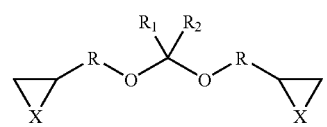

where each R is independently selected from $C_1$–$C_{10}$ alkyl, cycloalkyl, aryl, aralkyl, and alkaryl; $R_1$ and $R_2$ are each independently selected from hydrogen, methyl, ethyl, propyl, phenyl, hydroxyphenyl, methoxyphenyl, tolyl, and benzyl; and X is independently selected from O and S, provided that at least one X is S.

Particularly useful compounds of Formula I include acetals where each R is cyclohexane and at least one X is S. For example, such compounds may be represented by the following formula:

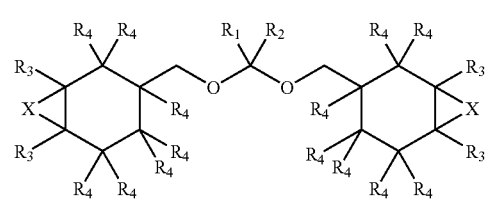

where $R_1$ and $R_2$ are each independently selected from hydrogen, methyl, ethyl, propyl, phenyl, hydroxyphenyl, methoxyphenyl, tolyl, and benzyl; each $R_3$ is independently selected from hydrogen, methyl, ethyl, propyl, and isopropyl; each $R_4$ is independently selected from hydrogen, methyl, ethyl, propyl, isopropyl, butyl, isobutyl, t-butyl, $C_{1-4}$ alkoxy, halogen, cyano and nitro; and X is independently selected from O and S, provided that at least one X is S.

Examples of such particularly desirable compounds within Formula II include:

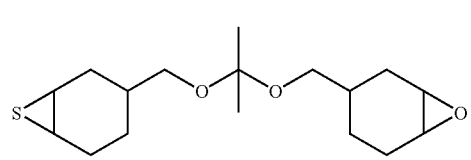

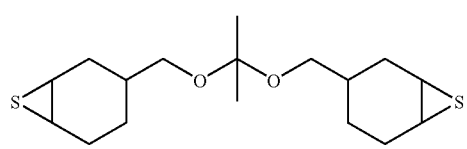

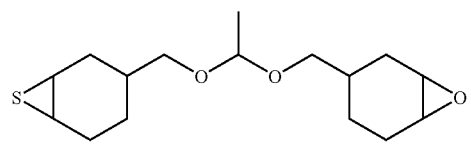

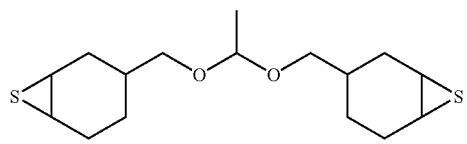

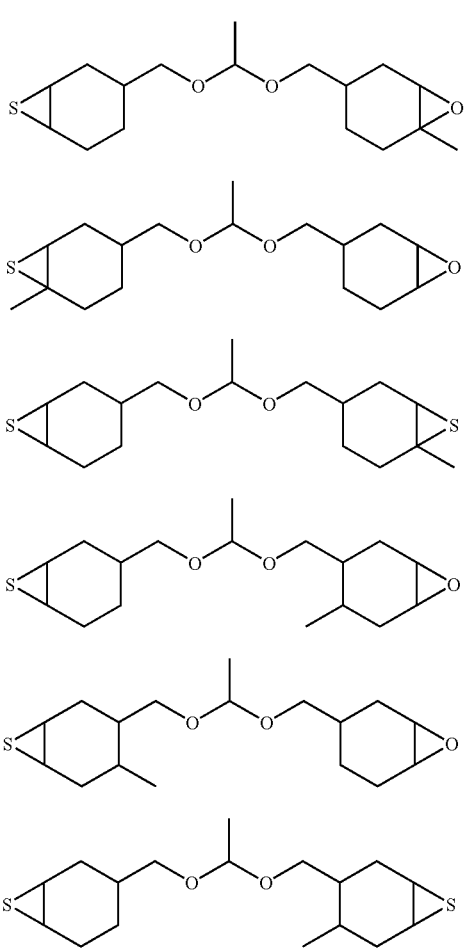

These curable compounds can be prepared from cycloaliphatic diene acetals having the following formula:

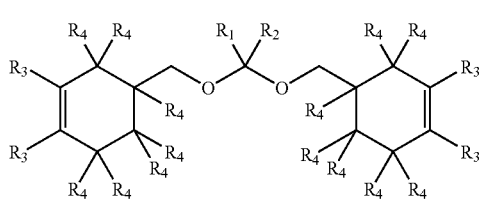

where $R_1$, $R_2$, $R_3$ and $R_4$ are as given above, which themselves are the condensation product of an aldehyde within formula A below:

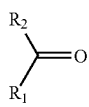

where $R_1$ and $R_2$ are as given above, with an alcohol within formula B below:

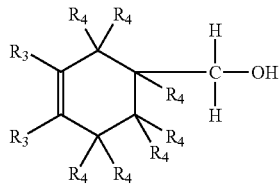

where $R_3$ and $R_4$ are as given above.

The diene may be epoxidized with a peracid (such as peracetic acid, perbenzoic acid, meta-chloroperbenzoic acid, and the like), with the reaction carried out until epoxidization of diene occurs, typically within a period of time of from 2 to 18 hours. The partial or full episulfide may then be formed from the epoxide by reaction with a sulfurizing agent to replace the epoxide linkages with episulfide linkages. These reactions are generally well known (see U.S. Pat. No. 3,378,522 to Martin). Examples of sulfurizing agents useful for conversion of epoxy compounds to episulfide compounds include thiourea and salts of isothiocyanates. Thiourea is particularly desirable, which can be added as a solid to an organic solution of the epoxy compound at temperatures maintained below about 30° C. Such conditions reduce the risk of side reactions, resulting in a product with excellent purity.

Other useful compounds include those of formula II having at least one thermally cleavable linkage and including a secondary or tertiary aromatic linkage. Such curable compounds are defined by formula II, where at least one of $R_1$ and $R_2$ is phenyl, hydroxyphenyl, methoxyphenyl, tolyl and benzyl. For example, particularly desirable compounds include those having the following structure:

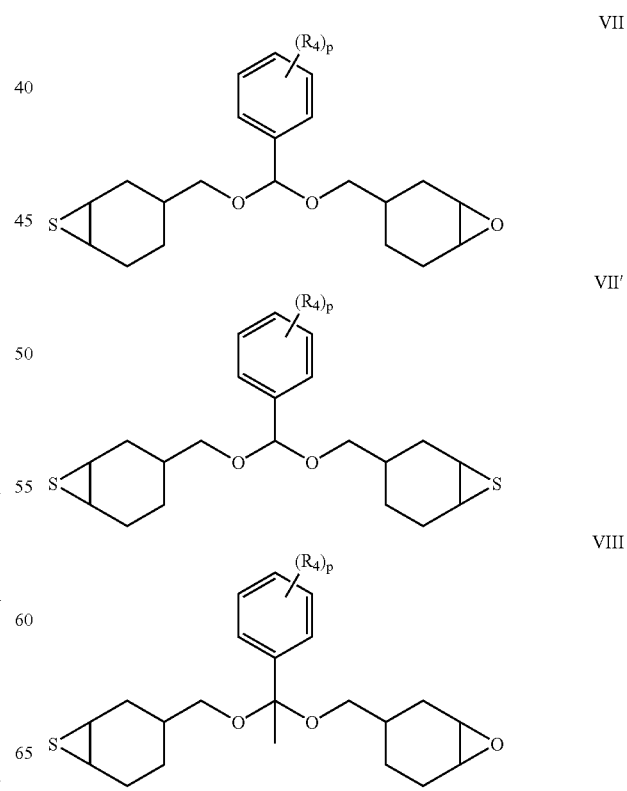

-continued

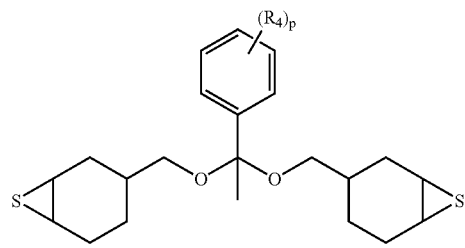
VIII' where R₄ is hydrogen, methyl, ethyl or propyl, and p is 1–5.

Alternatively, the curable compound with at least one thermally cleavable linkage may include an oxycarbonyl linkage as opposed to an acetal linkage. Such a curable compound may be represented by the following formula:

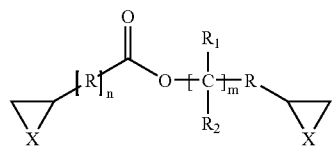
IX where each R is independently selected from $C_1$–$C_{10}$ alkyl, cycloalkyl, aryl, aralkyl, and alkaryl; $R_1$ and $R_2$ are each independently selected from hydrogen, methyl, ethyl, propyl, phenyl, hydroxyphenyl, methoxyphenyl, tolyl, and benzyl; m is 0 or 1; n is 0 or 1, and X is independently selected from O and S, provided that at least one X is S.

Particularly useful compounds of formula IX include esters where n is equal to 1, each R is cyclohexane and at least one X is S. For example, such compounds may be represented by the formula:

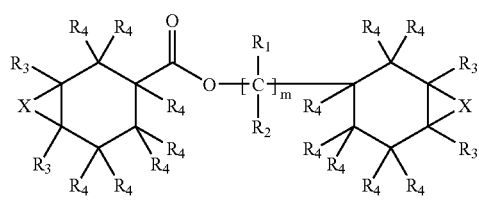
X where $R_1$ and $R_2$ are each independently selected from hydrogen, methyl, ethyl, propyl, phenyl, hydroxyphenyl, methoxyphenyl, tolyl, and benzyl; each $R_3$ is independently selected from hydrogen, methyl, ethyl, propyl, and isopropyl; each $R_4$ is independently selected from hydrogen, methyl, ethyl, propyl, isopropyl, butyl, isobutyl, t-butyl, $C_{1-4}$ alkoxy, halogen, cyano and nitro; m is 0 or 1, and X is independently selected from O and S, provided that at least one X is S.

Examples of such particularly desirable compounds within formula X include:

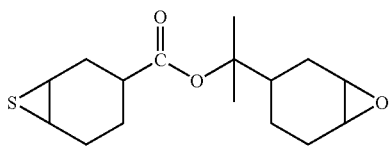
XI

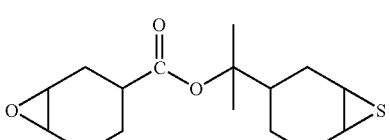
XI'

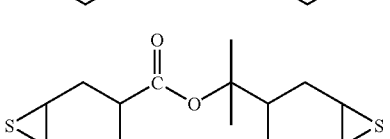
XI''

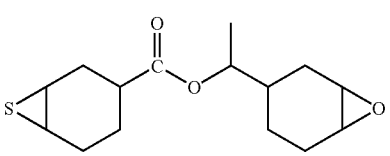
XII

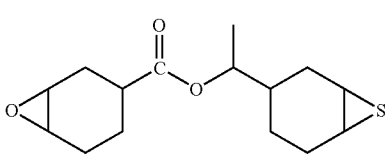
XII'

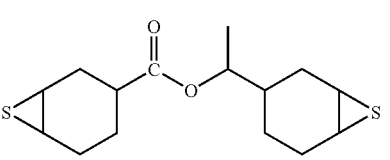
XII''

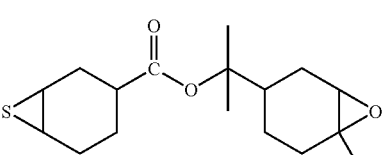
XIII

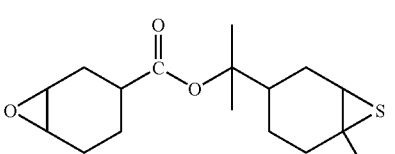
XIII'

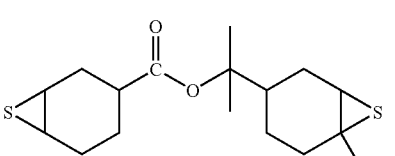
XIII''

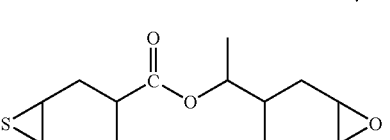
XIV

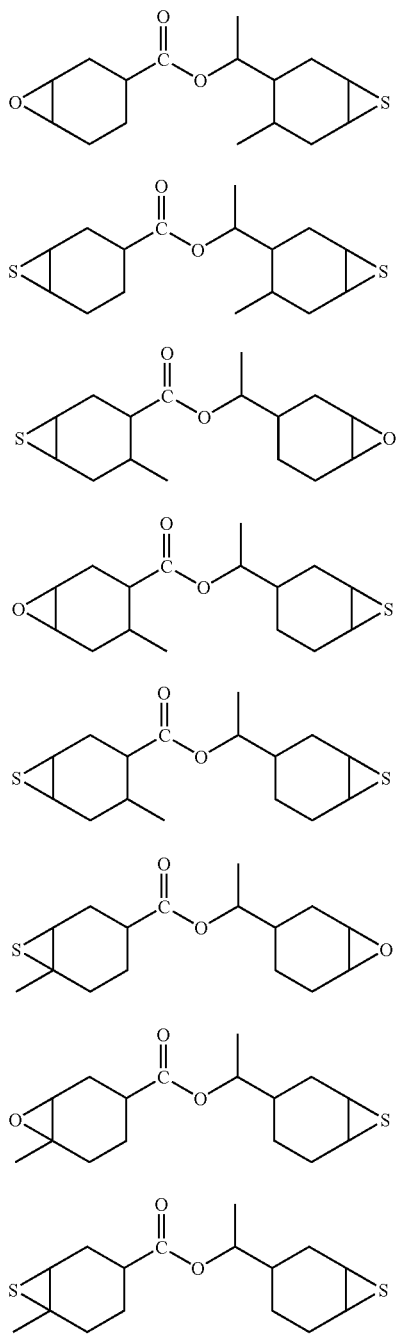

These curable compounds can be prepared from cycloaliphatic diene esters having the following formula:

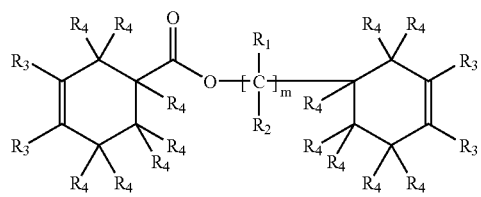

where $R_1$, $R_2$, $R_3$ and $R_4$ are as given above, which themselves are the condensation product of an alcohol within formula C below:

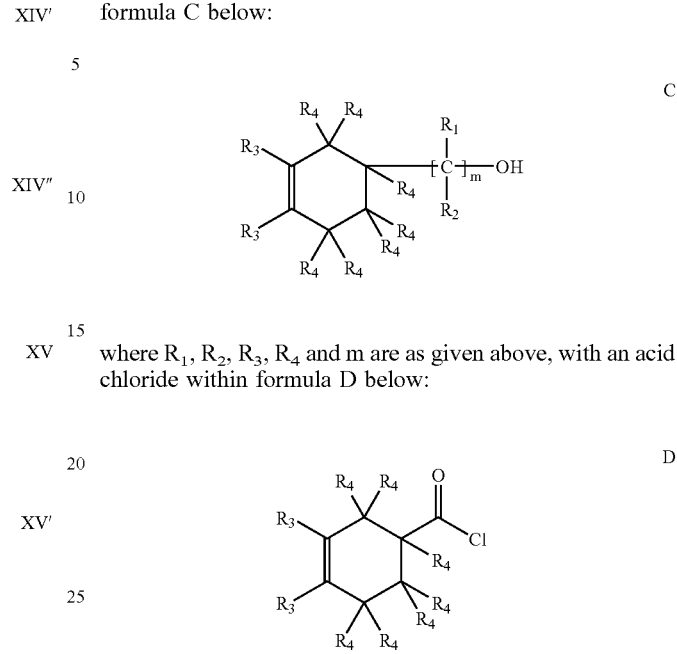

where $R_1$, $R_2$, $R_3$, $R_4$ and m are as given above, with an acid chloride within formula D below:

where $R_3$ and $R_4$ are as given above. The condensation reaction is ordinarily performed in an anhydrous polar solvent at a temperature ranging from 0 to 20° C. for a time period ranging from 6 to 18 hours.

Formation of epoxide and episulfide groups may be accomplished as described above.

Moreover, combinations of such compounds may also be used.

Other useful compounds include those of formula X having at least one thermally cleavable linkage and including a secondary or tertiary aromatic linkage. Such curable compounds are defined by formula X, where at least one of $R_1$ and $R_2$ is phenyl, hydroxyphenyl, methoxyphenyl, tolyl and benzyl. For example, particularly desirable compounds include those having the following structure:

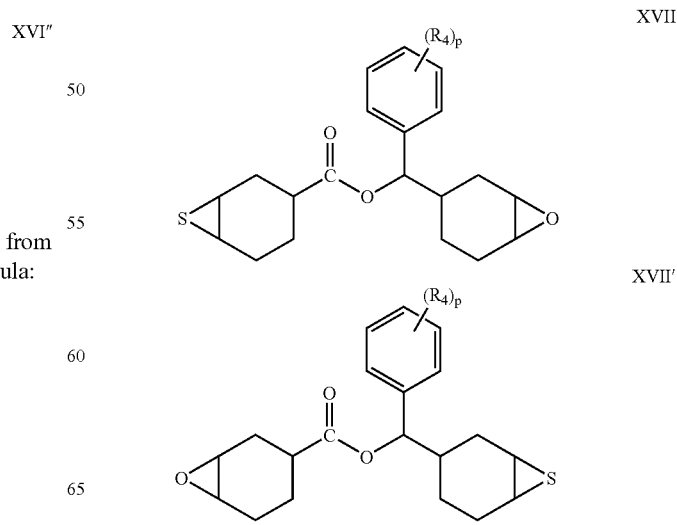

-continued

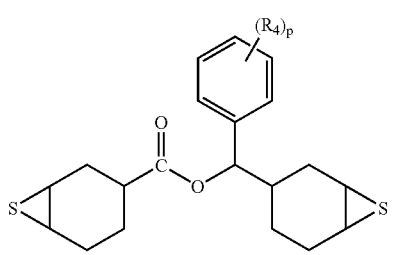

VXII″

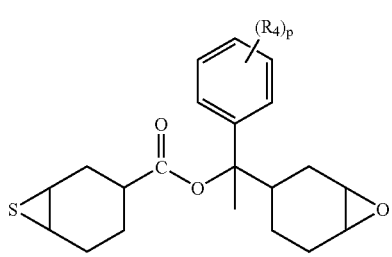

XVIII

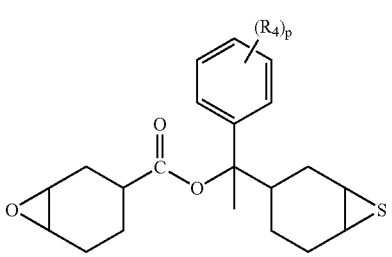

XVIII′

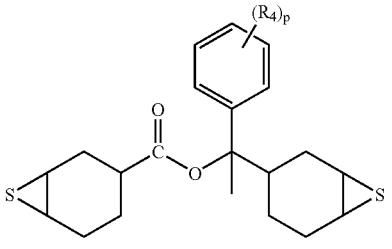

XVIII″ where $R_4$ is hydrogen, methyl, ethyl or propyl, and p is 1–5.

As noted above, the compounds of the present invention are useful in curable compositions such as thermosetting resin compositions, and are particularly useful as underfill sealants between a semiconductor device and a circuit board to which the semiconductor device is electrically connected. Thus, the present invention further includes a thermosetting resin composition which includes a curable component, at least a portion of which comprises a compound as described in detail above, incorporating a partial or full episulfide. Such a thermosetting resin composition may broadly include (a) a curable resin component, a portion of which is a curable compound having at least one thermally cleavable linkage and including an episulfide group, as discussed in detail above; (b) an optional inorganic filler component; and (c) a curing agent component including an anhydride component, a nitrogen-containing component, such as an amine compound, an amide compound, and/or an imidazole compound, and/or combinations thereof. Reaction products of these compositions are capable of softening under exposure to elevated temperature conditions, such as in excess of the temperature chosen to cure the composition. Loss of adhesion to the substrate occurs at temperatures greater than that used to cure the composition. For instance, a sufficient amount of adhesion is typically lost at temperatures in excess of about 200° C.

The presence in the curable resin component of the curable compound(s) with at least one thermally cleavable linkage allows for repair, replacement, recovery and/or recycling of operative electronic components from assemblies that have become at least in part inoperative.

As set forth above, the curable compound is selected from partial episulfide compounds, such as compounds incorporating both episulfide and epoxy groups, as well as complete episulfide compounds.

Typically, the composition includes about 10 to about 60 weight percent of the curable resin component by weight of the total composition, of which about 25 to about 75 weight percent thereof is comprised of the episulfide curable compound having at least one thermally cleavable linkage; about 0 to about 60 weight percent of the inorganic filler component; and 0.01 to about 60 weight percent of the curing agent component, of which about 0 to about 60 weight percent thereof is comprised of an anhydride compound, 0 to about 5 weight percent thereof is comprised of an amide compound, such as a cyano-functionalized amide, like dicyandamide, and 0 to about 2 weight percent thereof is comprised of an imidazole compound.

Of course, depending on the particular set of properties desirable for a composition destined for a specific purpose these values may vary somewhat. Such variation may be achieved without undue experimentation by those persons skilled in the art, and accordingly are contemplated within the scope of the present invention.

The curable resin component of the present invention may be the partial or complete episulfide counterpart of any common epoxy resin, such as a multifunctional epoxy resin, so long as at least a portion of the curable resin component includes an episulfide compound. Ordinarily, the multifunctional resin should be included in an amount within the range of about 15 weight percent to about 75 weight percent of the total of the curable resin component.

Examples include the partial or complete episulfide counterparts of the following multifunctional epoxy resins: bisphenol-A-type epoxy resin, bisphenol-F-type epoxy resin (such as RE-404-S from Nippon Kayaku, Japan), phenol novolac-type epoxy resin, and cresol novolac-type epoxy resin (such as "ARALDITE" ECN 1871 from Ciba Specialty Chemicals, Hawthorne, N.Y.).

Other suitable epoxy resins which can be reacted to form partial or complete episulfides include polyepoxy compounds based on aromatic amines and epichlorohydrin, such as N,N,N',N'-tetraglycidyl-4,4'-diaminodiphenyl methane; N-diglycidyl-4-aminophenyl glycidyl ether; and N,N,N',N'-tetraglycidyl-1,3-propylene bis-4-aminobenzoate, as well as polyglycidyl derivatives of phenolic compounds, such as those available commercially under the tradename "EPON", such as "EPON" 828, "EPON" 1001, "EPON" 1009, and "EPON" 1031 from Shell Chemical Co.; "DER" 331, "DER" 332, "DER" 334, and "DER" 542 from Dow Chemical Co.; and BREN-S from Nippon Kayaku. Partial and complete episulfides can also be formed from other suitable epoxy resins including polyepoxides prepared from polyols and the like and polyglycidyl derivatives of phenol-formaldehyde novolacs, the latter of which are available commercially under the tradename "DEN", such as "DEN" 431, "DEN" 438, and "DEN" 439 from Dow Chemical. Cresol analogs are also available commercially under the tradename "ARALDITE", such as "ARALDITE" ECN 1235, "ARALDITE" ECN 1273, and "ARALDITE" ECN 1299 from Ciba Specialty Chemicals Corporation. SU-8 is a bisphenol-A-type epoxy novolac available from Interez, Inc. Polyglycidyl adducts of amines, aminoalcohols and polycarboxylic acids are also useful in this invention, commercially available resins of which include "GLYAMINE" 135, "GLYAMINE" 125, and "GLYAMINE" 115 from F.I.C. Corporation; "ARALDITE" MY-720, "ARALDITE" 0500, and "ARALDITE" 0510 from Ciba Specialty Chemicals and PGA-X and PGA-C from the Sherwin-Williams Co.

And, of course, combinations of the different curable resins are also desirable for use herein.

As an inorganic filler component, many materials are potentially useful. For instance, the inorganic filler component may often include reinforcing silicas, such as fused silicas, and may be untreated or treated so as to alter the chemical nature of their surface. Virtually any reinforcing fused silica may be used.

Particularly desirable ones have a low ion concentration and are relatively small in particle size (e.g., in the range of about 2–10 microns, such as on the order of about 2 microns), such as the silica commercially available from Admatechs, Japan under the trade designation SO-E5.

Other desirable materials for use as the inorganic filler component include those constructed of or containing aluminum oxide, silicon nitride, aluminum nitride, silica-coated aluminum nitride, boron nitride and combinations thereof.

The curing agent component should include materials capable of catalyzing the polymerization of the epoxy resin component of the inventive compositions. Desirable curing agents for use with the present invention include an anhydride component, a nitrogen-containing component, such as an amine compound, an amide compound, and an imidazole compound, and combinations thereof.

Appropriate anhydride compounds for use herein include mono- and poly-anhydrides, such as hexahydrophthalic anhydride ("HHPA") and methyl hexahydrophthalic anhydride ("MHHPA") (commercially available from Lindau Chemicals, Inc., Columbia, S.C., used individually or as a combination, which combination is available under the trade designation "LINDRIDE" 62C) and 5-(2,5-dioxotetrahydrol)-3-methyl-3-cyclohexene-1,2-dicarboxylic anhydride (commercially available from ChrisKev Co., Leewood, Kans. under the trade designation B-4400).

Of course, combinations of these anhydride compounds are also desirable for use in the compositions of the present invention.

Examples of the amine compounds include aliphatic polyamines, such as diethylenetriamine, triethylenetetramine and diethylaminopropylamine; aromatic polyamines, such as m-xylenediamine and diaminodiphenylamine; and alicyclic polyamines, such as isophoronediamine and menthenediamine.

Aromatic polyamines and alicyclic polyamines are also desirable as curing agents, particularly 4,4'-methylenedianiline ("MDA") and 4,4'methylenebis(cyclohexylamine) ("MCA"). Of course, combinations of these amine compounds are also desirable for use in the compositions of the present invention.

Examples of amide compounds include cyano-functionalized amides, such as dicyandiamide.

The imidazole compounds may be chosen from imidazole, isoimidazole, and substituted imidazoles—such as alkyl-substituted imidazoles (e.g., 2-methyl imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-n-heptadecylimidazole, 2-undecylimidazole, 2-heptadecylimidazole, 2-ethyl 4-methylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition products of an imidazole and trimellitic acid, 2-n-heptadecyl-4-methylimidazole and the like, generally where each alkyl substituent contains up to about 17 carbon atoms and desirably up to about 6 carbon atoms), and aryl-substituted imidazoles [e.g., phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, and the like, generally where each aryl substituent contains up to about 10 carbon atoms and desirably up to about 8 carbon atoms].

Examples of commercial imidazole compounds are available from Air Products, Allentown, Pa. under the trade designation "CUREZOL" 1B2MZ and from Synthron, Inc., Morganton, N.C. under the trade designation "ACTIRON" NXJ-60; and from Borregaard Synthesis, Newburyport, Mass. under the trade designation "CURIMID CN".

Of course, combinations of these imidazole compounds are also desirable for use in the compositions of the present invention.

The curing agent component may be used in an amount of from about 5 to about 40 parts by weight, per 100 parts of the epoxy resin.

In addition, the composition may also include a flowability agent, such as a silane and/or titanate.

Appropriate silanes for use herein include octyl trimethoxy silane (commercially available from OSI Specialties Co., Danbury, Conn. under the trade designation A-137), and methacryloxy propyl trimethoxy silane (commercially available from OSI under the trade designation A-174).

Appropriate titanates for use herein include titanium IV tetrakis [2,2-bis[(2-propenyloxy)methyl]-1-butanolato-0] [bis(ditridecylphosphito-0), dihydrogen]$_2$ (commercially available from Kenrich Petrochemical Inc., Bayonne, N.J. under the trade designation KR-55).

When used, the flowability agent may be used in an amount of 0 to about 2 parts by weight, per 100 parts of the curable resin.

In addition, adhesion promoters, such as the silanes, glycidyl trimethoxysilane (commercially available from OSI under the trade designation A-187) or gamma-amino propyl triethoxysilane (commercially available from OSI under the trade designation A-1100), may be used.

Cyanate esters may also be used in the inventive compositions. The cyanate esters useful as a component in the inventive compositions may be chosen from dicyanatobenzenes, tricyanatobenzenes, dicyanatonaphthalenes, tricyanatonaphthalenes, dicyanato-biphenyl, bis(cyanatophenyl) methanes and alkyl derivatives thereof, bis (dihalocyanatophenyl)propanes, bis(cyanatophenyl)ethers, bis(cyanatophenyl)sulfides, bis(cyanatophenyl)propanes, tris(cyanatophenyl)phosphites, tris(cyanatophenyl)phosphates, bis(halocyanatophenyl)methanes, cyanated novolac, bis[cyanatophenyl(methylethylidene)]benzene, cyanated bisphenol-terminated thermoplastic oligomers, and combinations thereof.

More specifically, aryl compounds having at least one cyanate ester group on each molecule and may be generally represented by the formula $Ar(OCN)_m$, where Ar is an aromatic radical and m is an integer from 2 to 5. The aromatic radical Ar should contain at least 6 carbon atoms, and may be derived, for example, from aromatic hydrocarbons, such as benzene, biphenyl, naphthalene, anthracene, pyrene or the like. The aromatic radical Ar may also be derived from a polynuclear aromatic hydrocarbon in which at least two aromatic rings are attached to each other through a bridging group. Also included are aromatic radicals derived from novolac-type phenolic resins—i.e., cyanate esters of these phenolic resins. The aromatic radical Ar may also contain further ring-attached, non-reactive substituents.

Examples of such cyanate esters include, for instance, 1,3-dicyanatobenzene; 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)methane and 3,3',5,5'-tetramethyl bis(4-cyanatophenyl)methane; 2,2-bis(3,5-dichloro-4-cyanatophenyl)propane; 2,2-bis(3,5-dibromo-4-dicyanatophenyl)propane; bis(4-cyanatophenyl)ether; bis(4-cyanatophenyl)sulfide; 2,2-bis(4-cyanatophenyl)propane; tris(4-cyanatophenyl)-phosphite; tris(4-cyanatophenyl) phosphate; bis(3-chloro-4-cyanatophenyl)methane; cyanated novolac; 1,3-bis [4-cyanatophenyl-1-(methylethylidene)]benzene and cyanated bisphenol-terminated polycarbonate or other thermoplastic oligomer.

Other cyanate esters include cyanates disclosed in U.S. Pat. Nos. 4,477,629 and 4,528,366, the disclosure of each of which is hereby expressly incorporated herein by reference; the cyanate esters disclosed in U.K. Patent No. 1,305,702, and the cyanate esters disclosed in International Patent Publication WO 85/02184, the disclosure of each of which is hereby expressly incorporated herein by reference. Of course, combinations of these cyanate esters within the imidazole component of the compositions of the present invention are also desirably employed herein.

A particularly desirable cyanate ester for use herein is available commercially from Ciba Specialty Chemicals, Tarrytown, N.Y. under the tradename "AROCY" L10 [1,1-di(4-cyanatophenylethane)].

When used, the cyanate esters may be used in an amount of about 1 to about 20 weight percent based on the total amount of the epoxy resin component.

Conventional additives may also be used in the compositions of the present invention to achieve certain desired physical properties of the composition, the cured reaction product, or both.

For instance, it may be desirable in certain instances (particularly where a large volume of inorganic filler component is used) to include a reactive co-monomer component for the epoxy resin component, such as a reactive diluent.

Appropriate reactive diluents for use herein may include monofunctional or certain multifunctional epoxy resins. The reactive diluent should have a viscosity which is lower than that of the epoxy resin component. Ordinarily, the reactive diluent should have a viscosity less than about 250 cps. In the event such a monofunctional epoxy resin is included as a reactive diluent, such resin should be employed in an amount of up to about 50 parts based on the total of the epoxy resin component.

The monofunctional epoxy resin should have an epoxy group with an alkyl group of about 6 to about 28 carbon atoms, examples of which include $C_{6-28}$ alkyl glycidyl ethers, $C_{6-28}$ fatty acid glycidyl esters and $C_{6-28}$ alkylphenol glycidyl ethers.

Commercially available monofunctional epoxy resin reactive diluents include those from Pacific Epoxy Polymers, Richmond, Mich., under the trade designations PEP-6770 (glycidyl ester of neodecandoic acid), PEP-6740 (phenyl glycidyl ether) and PEP-6741 (butyl glycidyl ether).

Commercially available multifunctional epoxy resin reactive diluents include those from Pacific Epoxy Polymers, under the trade designations PEP-6752 (trimethylolpropane triglycidyl ether) and PEP-6760 (diglycidyl aniline).

The compositions of the present invention may further contain other additives, such as defoaming agents, leveling agents, dyes, and pigments. Moreover, photopolymerization initiators may also be incorporated therein, provided that such initiators do not adversely affect the properties of the composition or reaction products formed therefrom.

The thermosetting resin compositions of the present invention may be of the one-pack type, in which all the ingredients are mixed together, or of the two-pack type in which the curable component(s) is(are) included in one part and the curing agent is stored separately in a second part, and mixed together only prior to use.

During application, the thermosetting resin compositions according to the present invention penetrate and flow readily into the space between the semiconductor chip and the circuit board, or at least show a reduction in viscosity under heated or use conditions thus penetrating and flowing easily.

Generally, it is desirable to prepare thermosetting resin compositions of this invention by selecting the types and proportions of various components to reach a viscosity at a temperature of 25° C. in the range of 500 to 70,000 cps, such as 800 to 3,000 cps, depending on the amount present (if any) of an inorganic filler component, so as to improve its ability to penetrate into the space (e.g., of 10 to 200 μm) between the circuit board and the semiconductor device. At this viscosity, the gel times of the compositions will also be tailored to a specified period of time (such as 15 seconds, or 1 or 2 minutes) at a temperature of about 150° C. In such case, the inventive compositions should show no or substantially no increase of viscosity after a period of time of about six hours. With such a gel time, the compositions penetrate into the space (e.g., of 10 to 200 μm) between the circuit board and the semiconductor device relatively rapidly, and allow for a greater number of assemblies to be filled without observing a viscosity increase in the composition thereby rendering it less effective for application.

Reference to FIG. 1 shows a mounted structure (i.e., a FC package) in which a thermosetting resin composition of the present invention has been applied and cured.

The FC package 4 is formed by connecting a semiconductor chip (a bare chip) 2 to a carrier substrate 1 (e.g., a circuit board) and sealing the space therebetween suitably with a thermosetting resin composition 3.

More specifically, for example, in the assembly of FC semiconductor devices using SBB technology, the semiconductor chip 2 may be passed over a substrate bearing a conductive adhesive paste (such as a metal-filled epoxy) to form a layer thereof on the semiconductor chip 2. The layer is ordinarily formed by a printing mechanism. The conductive adhesive paste may be applied on either the carrier substrate or the semiconductor chip. One way to do this is with the stencil claimed and described in International Patent Publication No. PCT/FR95/00898. Alternatively, this connection may also be made by an anisotropically conductive adhesive. See International Patent Publication No. PCT/US97/13677.

Thereafter, the semiconductor chip 2 is positioned over the carrier substrate 1 in such a manner so that the semiconductor chip 2 is in alignment with the electrodes 5 and 6 on the carrier substrate 1, now coated with a patterned layer of conductive adhesive paste or solder, 7 and 8. The conductive adhesive paste may be cured by a variety of ways, though ordinarily a heat cure mechanism is employed.

In order to improve reliability, the space between the semiconductor chip 2 and the carrier substrate 1 is sealed with a thermosetting resin composition 3. The cured product of the thermosetting resin composition should completely fill that space.

The semiconductor chip ordinarily may be coated with a polyimide-, benzocyclobutane- or silicone nitride-based material to passivate environmental corrosion.

Carrier substrates may be constructed from ceramic substrates of $Al_2O_3$, $SiN_3$ and mullite ($Al_2O_3$—$SiO_2$); substrates or tapes of heat-resistant resins, such as polyimides; glass-reinforced epoxy; ABS and phenolic substrates which are also used commonly as circuit boards; and the like. Any electrical connection of the semiconductor chip to the carrier substrate may be used, such as connection by a high-melting solder or electrically (or anisotropically) conductive adhesive and the like. In order to facilitate connections, particularly in SBB technology, the electrodes may be formed as wire bond bumps.

After the semiconductor chip is electrically connected to the carrier substrate, the resulting structure is ordinarily subjected to a continuity test or the like. After passing such test, the semiconductor chip may be fixed thereto with a thermosetting resin composition, as described below. In this way, in the event of a failure, the semiconductor chip may be removed before it is fixed to the carrier substrate with the thermosetting resin composition.

Using a suitable application means, such as a dispenser, a thermosetting resin composition in accordance with this invention is applied to the periphery of the electronically-connected semiconductor chip. The composition penetrates by capillary action into the space between the carrier substrate and the semiconductor chip.

The thermosetting resin composition is then thermally cured by the application of heat. During the early stage of this heating, the thermosetting resin composition shows a significant reduction in viscosity and, hence, an increase in fluidity, so that it more easily penetrates into the space between the carrier substrate and the semiconductor chip. Moreover, by preheating the carrier substrate, the thermosetting resin composition is allowed to penetrate fully into the entire space between the carrier substrate and the semiconductor chip.

Thermosetting resin compositions of the present invention may ordinarily be cured by heating to a temperature in the range of about 120 to about 180° C. for a period of time of about 0.5 to 30 minutes. However, generally after application of the composition, an initial cure time of about 1 minute sets up the composition, and complete cure is observed after about 5 to about 15 minutes at 165° C. Thus, the composition of the present invention can be used at relatively moderate temperatures and short-time curing conditions, and, hence, achieve very good productivity.

The amount of thermosetting resin composition applied should be suitably adjusted so as to fill, almost completely, the space between the carrier substrate and the semiconductor chip, which amount, of course, may vary depending on application.

Cured reaction products of the thermosetting resin compositions of the present invention demonstrate excellent adhesive force, heat resistance and electric properties, and acceptable mechanical properties, such as flex-cracking resistance, chemical resistance, moisture resistance and the like, for the applications for which they are used herein.

In the mounting process by using the thermosetting resin composition of the present invention, after the semiconductor device is mounted on the circuit board as described above, the resulting structure is tested with respect to characteristics of the semiconductor device, connection between the semiconductor device and the circuit board, other electrical characteristics, and the state of sealing. In the event a failure is found, repair can be made in the following manner and as shown in the flow diagram depicted in FIG. 2.

The area around the semiconductor device which has failed is heated at a temperature of about 190 to about 260° C. for a period of time ranging from about 10 seconds to about 1 minute. (See FIG. 2, step 1.) Desirably, the temperature should be maintained in the range of about 210 to about 220° C. and the period of time should be within the 30 seconds to 1 minute range. Although no particular limitation is placed on the way in which heating occurs, localized heating is particularly desirable, such as the application of hot air to the failure site by a heating gun.

As soon as the solder is melted and the resin is softened by partial decomposition to cause a reduction in bond strength, the semiconductor device may be pulled apart and removed from the substrate, such as with tweezers or pliers.

After the semiconductor device 4 is removed, a residue of the cured reaction product of the thermosetting resin composition and a residue of the solder are left on the circuit board 5. The residue of the cured product of the thermosetting resin composition can be removed, for example, by scraping it off after the residue has been softened by heating it to a predetermined temperature.

The residue of the solder can be removed, for example, by use of a solder-absorbing braided wire. (See FIG. 2, step 2.)

Finally, a new semiconductor chip may be mounted again onto the circuit board (which has been cleaned as described above) in the manner as described above. (See FIG. 2, step 3.) Following mounting, a thermosetting resin composition in accordance with this invention may be dispensed in the area between the semiconductor device and the circuit board. (See FIG. 2, step 4.) Repair of the failure site is thus completed.

Where a failure site is found in the circuit board, the semiconductor device can be reused by removing the residue of the cured reaction product of the thermosetting resin composition and the residue of the solder left on the bottom of the semiconductor device in the same manner as described above.

EXAMPLE

A thermosetting resin composition in accordance with this invention can be prepared by mixing together, for a period of time of about 10 minutes at room temperature in an open vessel, the following components in the order noted:
1. a curable resin component including:
    24.95 grams of bisphenol-F-type epoxy resin (commercially available from Nippon Kayaku under the trade designation RE-404-S), and 24.95 grams of the episulfide compound having at least one thermally cleavable linkage represented by formula XIII"; and 2. a curing agent component including:
0.2 grams of an imidazole component (commercially available from Air Products under the trade designation "CUREZOL" 1B2MZ), and
50 grams of an anhydride component comprised of 42.42 grams of a mixture in an 50:50 ratio of "HHPA" and "MHHPA" anhydrides (commercially available from Lindau under the trade designation "LINDRIDE" 62C), and 7.48 grams of a cycloaliphatic dianhydride (commercially available from ChrisKev under the trade designation B-4400).

Such a compound can be used upon formation, or may be stored for a period of time of up to about 3 to about 6 months at a temperature of about −40° C. without experiencing viscosity increase.

Further, upon formation, the composition may be packaged in a syringe made of non-reactive plastic for later use.

The sample described above is presented as an illustrative, rather than a limiting, example of the inventive compositions. Many additional embodiments thereof are included in the spirit and scope of the invention, which is defined by the claims.

The invention claimed is:

1. A curable composition comprising a compound having at least one thermally cleavable linkage represented by the formula:

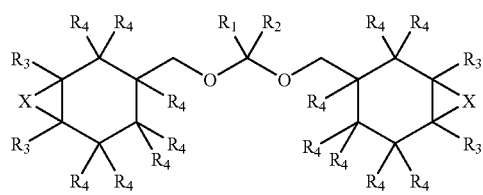

II where $R_1$ and $R_2$ are each independently selected from the group consisting of hydrogen, methyl, ethyl, propyl, phenyl, hydroxyphenyl, methoxyphenyl, tolyl, and benzyl; each $R_3$ is independently selected from the group consisting of hydrogen, methyl, ethyl, propyl and isopropyl; each $R_4$ is independently selected from the group consisting of hydrogen, methyl, ethyl, propyl, isopropyl, butyl, isobutyl, t-butyl, $C_{1-4}$ alkoxy, halogen, cyano, and nitro; and X is independently selected from O and S, provided that at least one X is S.

2. A curable composition as in claim 1, wherein said compound is selected from the group consisting of:

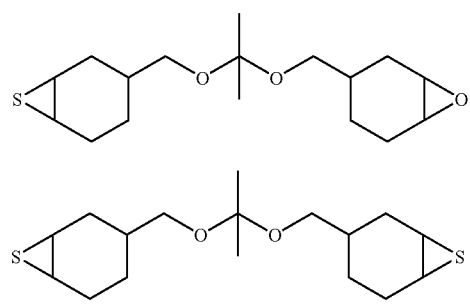

III

III'

-continued

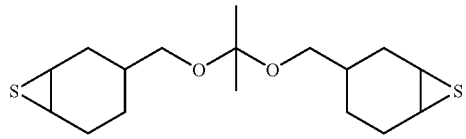

IV

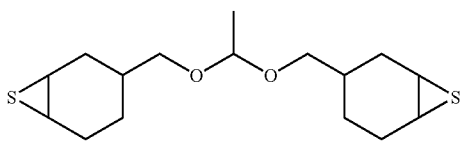

IV'

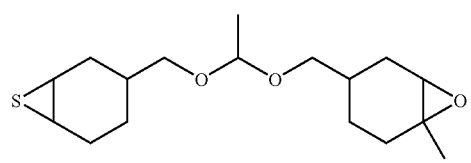

V

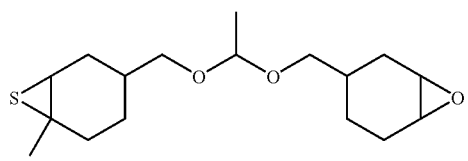

V'

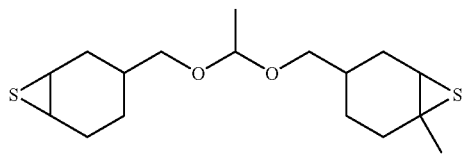

V"

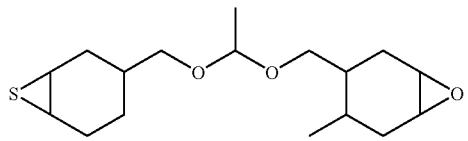

VI

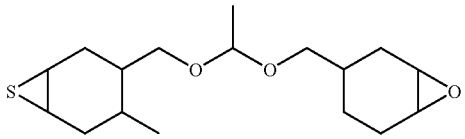

VI'

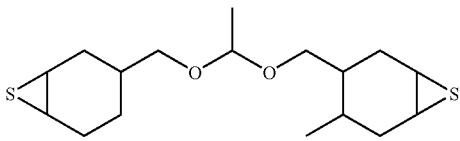

VI"

3. A curable composition comprising a compound having at least one thermally cleavable linkage represented by the formula:

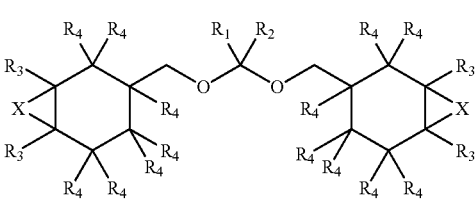

II where $R_1$ and $R_2$ are each independently selected from the group consisting of hydrogen, methyl, ethyl, propyl, phenyl, hydroxyphenyl, methoxyphenyl, tolyl, ethylphenyl, propylphenyl, and benzyl; each R₃ is independently selected from the group consisting of hydrogen, methyl, ethyl, propyl and isopropyl; each R₄ is independently selected from the group consisting of hydrogen, methyl, ethyl, propyl, isopropyl, butyl, isobutyl, t-butyl, $C_{1-4}$ alkoxy, halogen, cyano, and nitro; and X is independently selected from O and S, provided that at least one X is S, wherein said compound is selected from the group consisting of:

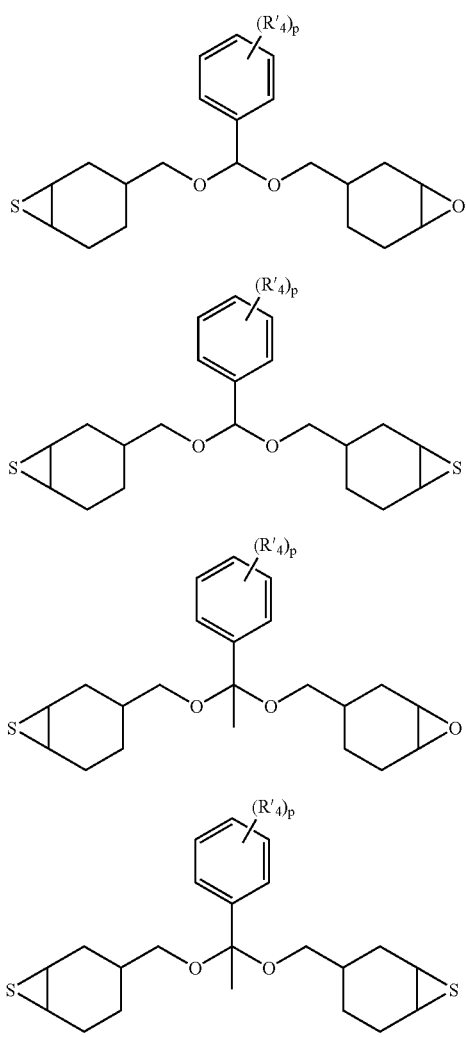

VII

VII'

VIII

VIII' wherein $R'_4$ is a member selected from the group consisting of hydrogen, methyl, ethyl and propyl; and p is 1–5.

4. A curable composition comprising a compound having at least one thermally cleavable linkage, wherein said compound is selected from the group consisting of:

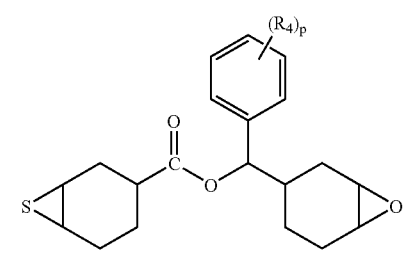

XVII

-continued

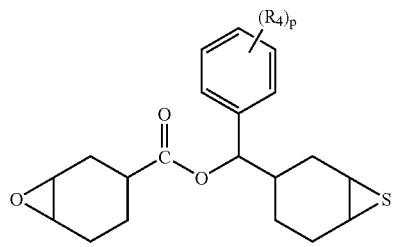

XVII'

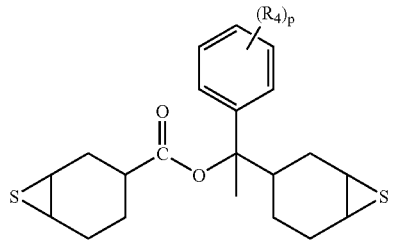

VXII''

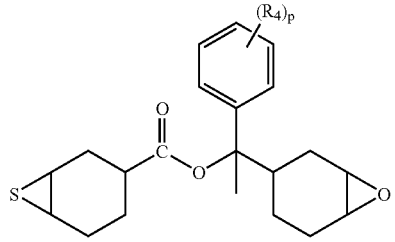

XVIII

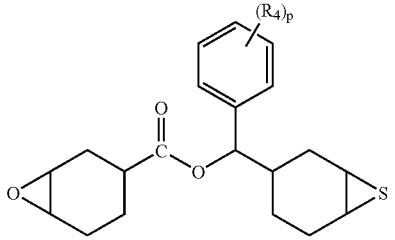

XVIII'

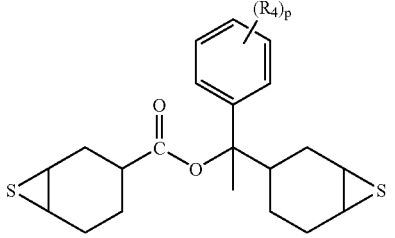

XVIII'' where R₄ is hydrogen, methyl, ethyl or propyl, and p is 1–5.

5. A thermosetting resin composition comprising:
  I) a curable resin component, at least a portion of which comprises a curable composition comprising a compound having at least one thermally cleavable linkage and being selected from the group consisting of:

a)

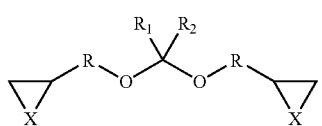

I where each R is independently selected from the group consisting of $C_1$–$C_{10}$ alkylene, cycloalkylene, arylene, aralkylene, and alkarylene; $R_1$ and $R_2$ are each independently selected from the group consisting of hydrogen, methyl, ethyl, propyl, phenyl, hydroxyphenyl, methoxyphenyl, tolyl, and benzyl; and X is independently selected from O and S, provided that at least one X is S; and b)

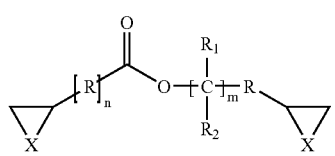

IX where each R is independently selected from the group consisting of $C_1$–$C_{10}$ alkylene, cycloalkylene, arylene, aralkylene, and alkarylene; $R_1$ and $R_2$ are each independently selected from the group consisting of hydrogen, methyl, ethyl, propyl, phenyl, hydroxyphenyl, methoxyphenyl, tolyl, and benzyl; m is 0 or 1; n is 0 or 1; and X is independently selected from O and S, provided that at least one X is S;

and combinations thereof;

II) a curing agent component comprising a member selected from the group consisting of anhydride compounds, amine compounds, amide compounds, imidazole compounds, and combinations thereof;

III) one or more materials selected from the group consisting of flowability agents, adhesion promoters, and cyanate esters; and IV) optionally, an inorganic filler component.

6. A thermosetting resin composition as in claim 5, reaction products of which are reworkable through thermal decomposition under exposure to temperature conditions in excess of those used to cure the composition.

7. A thermosetting resin composition according to claim 5, wherein the flowability agent is a member selected from the group consisting of silanes, titanates and combinations thereof.

8. A thermosetting resin composition according to claim 5, wherein the adhesion promoter is a member selected from the group consisting of glycidyl trimethoxysilane, gamma-amino propyl triethoxysilane, and combinations thereof.

9. A thermosetting resin composition according to claim 5, wherein the inorganic filler component may be selected from the group consisting of materials constructed of or containing reinforcing silicas, aluminum oxide, silicon nitride, aluminum nitride, silica-coated aluminum nitride, boron nitride, and combinations thereof.

10. A thermosetting resin composition according to claim 5, wherein the anhydride compounds of the curing agent component may be selected from the group consisting of hexahydrophthalic anhydride, methyl hexahydrophthalic anhydride, 5-(2,5-dioxotetrahydrol)-3-methyl-3-cyclohexene-1,2-dicarboxylic anhydride, and combinations thereof.

11. A thermosetting resin composition according to claim 5, wherein the amine compounds of the curing agent component may be selected from the group consisting of dicyandiamide, diethylenetriamine, triethylenetetramine, diethylaminopropylamine, m-xylenediamine, diaminodiphenylamine, isophoronediamine, menthenediamine, polyamides, 4,4'-methylenedianiline, 4,4'-methylenebis(cyclohexylamine), and combinations thereof.

12. A thermosetting resin composition according to claim 5, wherein the amide is dicyandiamide.

13. A thermosetting resin composition according to claim 5, wherein the imidazole compounds of the curing agent component may be selected from the group consisting of imidazole, isoimidazole, 2-methyl imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-n-heptadecylimidazole, 2-undecylimidazole, 2-heptadecylimidazole, 2-ethyl 4-methylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole, addition products of an imidazole and trimellitic acid, addition products of an imidazole and 2-n-heptadecyl-4-methylimidazole, phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)4,5-diphenylimidazole, 2-(3-hydroxyphenyl)-4-, 5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, and combinations thereof.

14. A thermosetting resin composition according to claim 5, wherein the curing agent component is used in an amount of from about 3 to about 60 parts by weight, per 100 parts by weight of the curable resin.

15. A thermosetting resin composition according to claim 5, wherein the curing agent component is used in an amount of from about 5 to about 40 parts by weight, per 100 parts of the curable resin.

16. A thermosetting resin composition according to claim 5, wherein the thermosetting resin composition is capable of sealing underfilling between a semiconductor device including a semiconductor chip mounted on a carrier substrate and a circuit board to which said semiconductor device is electrically connected, reaction products of which are capable of softening and losing their adhesiveness under exposure to temperature conditions in excess of those used to cure the composition.

17. An electronic device comprising a semiconductor device and a circuit board to which said semiconductor device is electrically connected assembled using a thermosetting resin composition according to claim 5 as an underfill sealant between the semiconductor device and the circuit board, wherein reaction products of the composition are capable of softening and losing their adhesiveness under exposure to temperature conditions in excess of those used to cure the composition.

18. A compound represented by the formula:

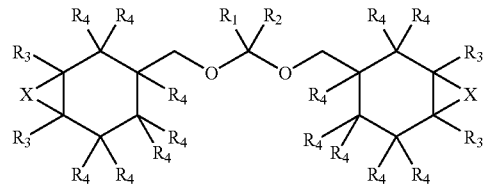

where $R_1$ and $R_2$ are each independently selected from hydrogen, methyl, ethyl, propyl, phenyl, hydroxyphenyl, methoxyphenyl, tolyl, and benzyl; each $R_3$ is independently selected from hydrogen, methyl, ethyl, propyl, and isopropyl; each $R_4$ is independently selected from hydrogen, methyl, ethyl, propyl, isopropyl, butyl, isobutyl, t-butyl, $C_{1-4}$ alkoxy, halogen, cyano and nitro; and X is independently selected from O and S, provided that at least one X is S.

* * * * *